United States Patent
Kaufman et al.

(10) Patent No.: US 7,289,260 B2
(45) Date of Patent: Oct. 30, 2007

(54) MULTIFOCAL LENS

(75) Inventors: Micha Kaufman, Binyamina (IL); Kalman Kaufman, Caesarea (IL)

(73) Assignee: Invisia Ltd., Binyamina (IL)

( * ) Notice: Subject to any disclaimer, the term of this patent is extended or adjusted under 35 U.S.C. 154(b) by 0 days.

(21) Appl. No.: 10/595,270

(22) PCT Filed: Aug. 30, 2004

(86) PCT No.: PCT/IL2004/000786

§ 371 (c)(1), (2), (4) Date: Jun. 14, 2006

(87) PCT Pub. No.: WO2005/033782

PCT Pub. Date: Apr. 14, 2005

(65) Prior Publication Data

US 2007/0052876 A1    Mar. 8, 2007

Related U.S. Application Data

(60) Provisional application No. 60/582,552, filed on Jun. 25, 2004, provisional application No. 60/543,567, filed on Feb. 12, 2004, provisional application No. 60/507,940, filed on Oct. 3, 2003.

(51) Int. Cl.
G02F 1/29 (2006.01)
G02C 7/04 (2006.01)
G02C 7/06 (2006.01)
G02F 1/1335 (2006.01)

(52) U.S. Cl. .............. 359/319; 351/161; 351/168; 349/13

(58) Field of Classification Search ........... 349/13, 349/200; 351/161, 168, 171, 176; 359/319, 359/666, 721
See application file for complete search history.

(56) References Cited

U.S. PATENT DOCUMENTS

| | | | |
|---|---|---|---|
| 4,190,330 A | 2/1980 | Berreman | |
| 4,300,818 A | 11/1981 | Schachar | |
| 4,564,267 A | 1/1986 | Nishimoto et al. | |
| 4,572,616 A | 2/1986 | Kowel et al. | |
| 4,601,545 A | 7/1986 | Kern | |
| 4,756,605 A | 7/1988 | Okada et al. | |
| 4,842,400 A * | 6/1989 | Klein | 351/158 |
| 5,073,021 A | 12/1991 | Marron | |
| 5,108,169 A | 4/1992 | Mandell | |
| 5,142,411 A | 8/1992 | Fiala | |
| 5,359,444 A | 10/1994 | Piosenka et al. | |
| 5,410,375 A | 4/1995 | Fiala et al. | |
| 5,712,721 A | 1/1998 | Large et al. | |
| 5,861,936 A | 1/1999 | Sorensen et al. | |

(Continued)

OTHER PUBLICATIONS

U.S. Appl. No. 60/507,940, filed Oct. 3, 2003.

(Continued)

*Primary Examiner*—David N. Spector
(74) *Attorney, Agent, or Firm*—Darby & Darby

(57) ABSTRACT

Apparatus for enhancing vision of a user includes a focal modulation device (22), which is adapted to focus light from objects in a field of view of the user onto the retina while alternating between at least first and second focal states that are characterized by different, respective first and second focal depths, at a rate in excess of a flicker-fusion frequency of the user.

21 Claims, 11 Drawing Sheets

U.S. PATENT DOCUMENTS

| | | |
|---|---|---|
| 6,491,391 B1 | 12/2002 | Blum et al. |
| 6,491,394 B1 | 12/2002 | Blum et al. |
| 6,517,203 B1 | 2/2003 | Blum et al. |
| 6,577,434 B2 | 6/2003 | Hamada et al. |
| 6,638,304 B2 | 10/2003 | Azar |
| 6,714,174 B2 | 3/2004 | Suyama et al. |
| 7,018,040 B2 * | 3/2006 | Blum et al. ............. 351/160 R |
| 7,118,214 B2 * | 10/2006 | Cox ........................... 351/161 |
| 2002/0140899 A1 | 10/2002 | Blum et al. |
| 2003/0018383 A1 | 1/2003 | Azar |
| 2004/0027501 A1 | 2/2004 | Blum et al. |
| 2004/0056986 A1 | 3/2004 | Blum et al. |

OTHER PUBLICATIONS

U.S. Appl. No. 60/543,567, filed Feb. 12, 2004.

* cited by examiner

MULTIFOCAL LENS

CROSS-REFERENCE TO PRIOR APPLICATION

The above-referenced application is the U.S. National Phase of International Patent Application PCT/IL2004/000786 filed Aug. 30, 2004, which claims priority from U.S. Provisional Application Nos. 60/507,940 filed Oct. 3, 2003; 60/543,567 filed Feb. 12, 2004; and 60/582,552 filed Jun. 25, 2004, all of which are incorporated by reference herein. The International application was published in English on Apr. 14, 2005 as WO 2005/033782 A2 under PCT article 21(2).

FIELD OF THE INVENTION

The present invention relates generally to optical devices, and specifically to electronically-modulated multifocal lenses and methods for manufacture of such lenses.

BACKGROUND OF THE INVENTION

Accommodation enables a person of normal vision to focus on objects from infinity to a near point, typically of the order of 25 cm or less from the eye. Presbyopes lose the ability to accommodate over such a large range and typically require two or more corrections: a distance correction for focusing to infinity, a near correction for focusing to close objects, and occasionally one or more intermediate focusing corrections. Patients whose natural, crystalline lens has been excised (due to cataracts, for example) lose the ability to accommodate altogether.

Multifocal spectacles provide two or more corrections for each eye in separate regions of one lens. Such spectacles rely on the fact that the spectacle lenses are relatively fixed with respect to the eye, so that the spectacle wearer usually looks through the higher portions of the lens for distant objects, and the lower portion of the lens for near objects. Multifocal contact lenses and intraocular lenses that provide both distant and near corrections for a particular eye in a single lens are also known in the art. Unlike spectacle lenses, however, contact lenses and intraocular lenses move with the motion of the eye. A number of different approaches have been proposed to overcome this difficulty.

For example, U.S. Pat. No. 5,073,021, whose disclosure is incorporated herein by reference, describes a bifocal ophthalmic lens constructed from birefringent material. The dual focal property arises due to the differing indices of refraction of the birefringent material for light polarized parallel to the fast and slow axes of the material. Light emanating from far objects having one polarization and light emanating from near objects having the opposite polarization are both focused onto the user's retina. Thus, an in-focus and a blurred image may appear simultaneously on the user's retina. The ability of the user's eye/brain system to distinguish between the two images provides bifocal action from a single lens.

As another example, U.S. Pat. No. 4,300,818, whose disclosure is incorporated herein by reference, describes a multifocal ophthalmic lens, which provides a variable focusing power lens for near and distant corrected vision. The lens includes electrodes disposed between first and second lens elements, with a film of liquid crystal between the electrodes. A voltage is applied to the electrodes to vary the index of refraction presented by the liquid crystal film, and thus to provide a variation in the refraction and focal length of the lens elements.

Similarly, U.S. Pat. No. 5,712,721, whose disclosure is incorporated herein by reference, describes a switchable lens, whose focal length may be changed by application of an electrical or magnetic field. A switching means provides a drive impulse to change the focal length of the lens. An integral power source, such as a miniature battery or a photocell, provides power for the switching means. This arrangement permits a user of the lens to switch between near and distance vision.

SUMMARY OF THE INVENTION

Despite the long-felt need for effective multifocal contact lenses and intraocular lenses, such lenses have not yet gained wide acceptance. Embodiments of the present invention provide devices and techniques that overcome the limitations of the prior art and can thus be applied to produce multifocal lenses that are reliable, inexpensive, and simple to use, while affording correction of vision at multiple distances simultaneously.

In some embodiments of the present invention, a multifocal lens comprises a transparent optoelectronic focal modulation device encapsulated within a lens body. Typically, the focal modulation device comprises a spatial light modulator (SLM), comprising an array of miniature light-modulating elements, such as liquid crystal cells. Alternatively, other types of optoelectronic focal modulation devices may be used and are also considered to be within the scope of the present invention. The lens body is shaped to give a predetermined, basic refractive power. The focal modulation device is operable to alter its refractive index, and thus modulate the overall refractive power of the multifocal lens.

In some of these embodiments, the focal modulation device is fabricated on an integrated circuit chip together with a controller and a photovoltaic power source. The entire chip is encapsulated within the lens body, and thus operates without any external source of power or control. In one embodiment, the focal modulation device comprises an array of liquid crystal cells, which are formed on the chip by a novel process. Recesses defining the liquid crystal cells are formed in the chip by photolithography. After injection of the liquid crystal material into the recesses, the cells are sealed with a polymer layer. This process obviates the need for a glass cover over the liquid crystal cells, and thus facilitates the creation of integrated liquid crystal devices that are thinner and less costly to produce than devices known in the art. This fabrication technique is useful not only in producing the multifocal lenses described herein, but also in other applications in which arrays of cells containing liquid crystal or other non-solid media are used.

In some embodiments of the present invention, the multifocal lens operates by switching rapidly between two or more focal states: a near-focus state, in which objects relatively close to the user's eye are focused on the retina; a distant-focus state, in which distant objects are in focus; and possibly one or more intermediate-focus states. The switching of focal depth occurs faster than the flicker-fusion frequency of the eye, so that the user is not consciously aware of the varying focal state. Such switching is typically accomplished by operation of the encapsulated optoelectronic focal modulation device described above, but it may alternatively be accomplished using other suitable means. The inventors have found that rapid switching of the focal state of the lens gives the user enhanced visual perception of both near and distant objects, in comparison with multifocal lenses known in the art that focus both near and far objects onto the retina simultaneously.

There is therefore provided, in accordance with an embodiment of the present invention, apparatus for enhancing vision of a user having an eye that includes a retina, the apparatus including:

a focal modulation device, which is adapted to focus light from objects in a field of view of the user onto the retina while alternating between at least first and second focal states that are characterized by different, respective first and second focal depths, at a rate in excess of a flicker-fusion frequency of the user.

Typically, in the first focal state, the focal modulation device is operative to focus the light from distant objects onto the retina, and in the second focal state, the focal modulation device is operative to focus the light from near objects onto the retina.

In some embodiments, the apparatus includes a lens body, including a transparent optical material having a predetermined refractive power, wherein the focal modulation device is adapted to modulate the refractive power of the lens body. In disclosed embodiments, the focal modulation device is encapsulated in the lens body. In one embodiment, the lens body is adapted to serve as a contact lens on a surface of the eye. In another embodiment, the lens body is adapted to be implanted as an intraocular lens within the eye. In yet another embodiment, the lens body is adapted to serve as a spectacle lens.

In a disclosed embodiment, the focal modulation device includes a spatial light modulator (SLM), which is adapted to focus the light, and a control circuit, which is coupled to actuate the SLM so as to alternate between the first and second focal states.

In one embodiment, the focal modulation device is adapted to alternate between the first and second focal states and a third focal state, which is characterized by a third focal depth, intermediate the first and second focal depths.

Typically, the focal modulation device is adapted to alternate between the at least first and second focal states with a period of alternation between 12 ms and 30 ms.

There is also provided, in accordance with an embodiment of the present invention, a lens, including:

a lens body, including a transparent optical material having a predetermined refractive power; and a focal modulation device fixed to the lens body and including:

a semiconductor substrate;

a spatial light modulator (SLM) formed on the substrate so as to permit light collected by the lens body to pass through the SLM;

a control circuit, which is formed on the substrate and is coupled to actuate the SLM so as to modulate the refractive power that is applied to the light passing through the SLM; and a photovoltaic cell, which is formed on the substrate and is coupled to provide electrical power to the control circuit responsively to light that is incident on the photovoltaic cell.

In some embodiments, the control circuit is adapted to actuate the SLM so as to cause the lens to alternate between at least first and second focal states that are characterized by different, respective first and second focal depths, at a rate in excess of a flicker-fusion frequency of a user of the multifocal lens. Typically, the focal modulation device includes an oscillator, which is coupled to provide a clock signal to the control circuit, and the control circuit is adapted to determine the rate of alternation between the first and second focal states responsively to the clock signal. Thus, the control circuit is adapted to determine the rate of alternation between the first and second focal states independently of any signal generated externally to the lens.

In a disclosed embodiment, the SLM includes a matrix of liquid crystal elements. Typically, the matrix of liquid crystal elements includes an insulating layer deposited on the substrate and having recesses formed therein so as to define the matrix, a liquid crystal material contained within the recesses, and a polymer layer formed over the recesses so as to hold the liquid crystal material within the recesses. Furthermore, the focal modulation device may include a plurality of conductors formed on the substrate so as to couple the control circuit to the liquid crystal elements, and the polymer layer may include a conductive material which is coupled to provide a common ground contact for the matrix of the liquid crystal elements.

There is additionally provided, in accordance with an embodiment of the present invention, an electronic device, including:

a semiconductor substrate;

an insulating layer formed on the substrate and having a matrix of recesses formed therein;

a non-solid material contained within the recesses;

a plurality of conductors, formed on the substrate and in communication with the recesses, so as to perform at least one of conveying electrical input signals to the non-solid material and receiving electrical output signals from the non-solid material; and a polymer layer formed over the recesses so as to hold the non-solid material within the recesses.

In a disclosed embodiment, the non-solid material includes a liquid crystal material, and the device includes a control circuit, which is formed on the substrate and is coupled to convey the electrical input signals through the conductors to the liquid crystal material in the recesses so as to spatially modulate light passing through the device.

Typically, the polymer layer includes a conductive material which is coupled to provide a common ground contact for the non-solid material within the recesses.

In some embodiments, the semiconductor substrate includes a first side, on which the insulating layer and conductors are formed, and a second side, and the second side is thinned so as to permit light to be incident on the non-solid material via the second side. Typically, the device includes a transparent layer formed on the substrate below the matrix of recesses in the insulating layer, wherein the second side of the substrate is thinned so as to expose the transparent layer.

There is further provided, in accordance with an embodiment of the present invention, a method for enhancing vision of a user having an eye that includes a retina, the method including focusing light from objects in a field of view of the user onto the retina in alternation between at least first and second focal states that are characterized by different, respective first and second focal depths, at a rate of alternation that is in excess of a flicker-fusion frequency of the user.

There is moreover provided, in accordance with an embodiment of the present invention, a method for producing a lens, including:

forming a spatial light modulator (SLM) on a semiconductor substrate;

forming a control circuit on the substrate, so that the control circuit is coupled to actuate the SLM;

forming a photovoltaic cell on the substrate, so that the photovoltaic cell is coupled to provide electrical power to the control circuit responsively to light that is incident on the photovoltaic cell.

There is furthermore provided, in accordance with an embodiment of the present invention, a method for producing an electronic device, including:

depositing an insulating layer on a semiconductor substrate, the insulating layer having a matrix of recesses formed therein;

filling the recesses with a non-solid material;

forming a plurality of conductors on the substrate in communication with the recesses, so as to perform at least one of conveying electrical input signals to the non-solid material and receiving electrical output signals from the non-solid material; and forming a polymer layer over the recesses so as to hold the non-solid material within the recesses.

There is also provided, in accordance with an embodiment of the present invention, a focal modulation device, comprising:

a semiconductor substrate;

a spatial light modulator (SLM) formed on the substrate so as to permit light to pass through the SLM;

a control circuit, which is formed on the substrate and is coupled to actuate the SLM so as to modulate the refractive power that is applied to the light passing through the SLM; and a photovoltaic cell, which is formed on the substrate and is coupled to provide electrical power to the control circuit responsively to light that is incident on the photovoltaic cell.

The present invention will be more fully understood from the following detailed description of the embodiments thereof, taken together with the drawings in which:

DETAILED DESCRIPTION OF EMBODIMENTS

Figure 1:
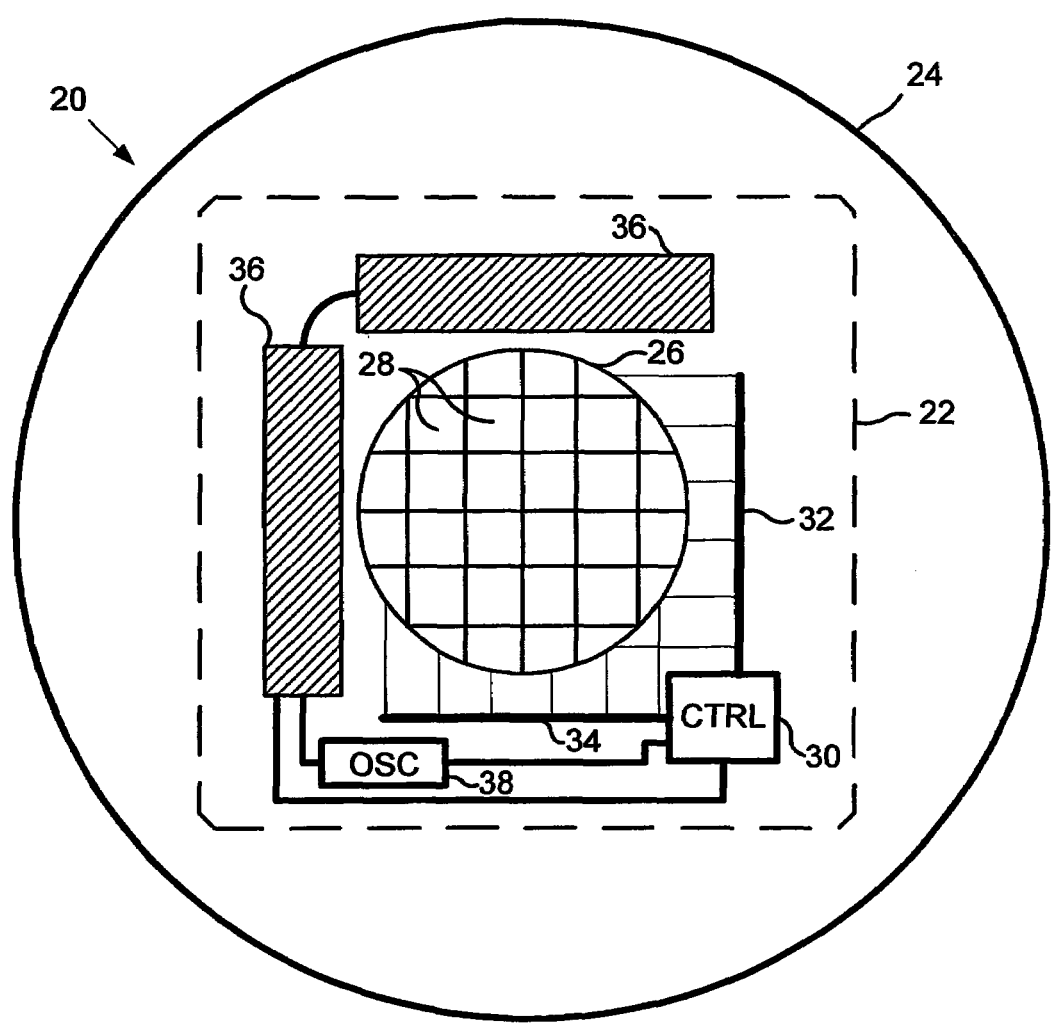
FIG. 1 is a schematic frontal view of a multifocal contact lens, in accordance with an embodiment of the present invention.
Figure 2:
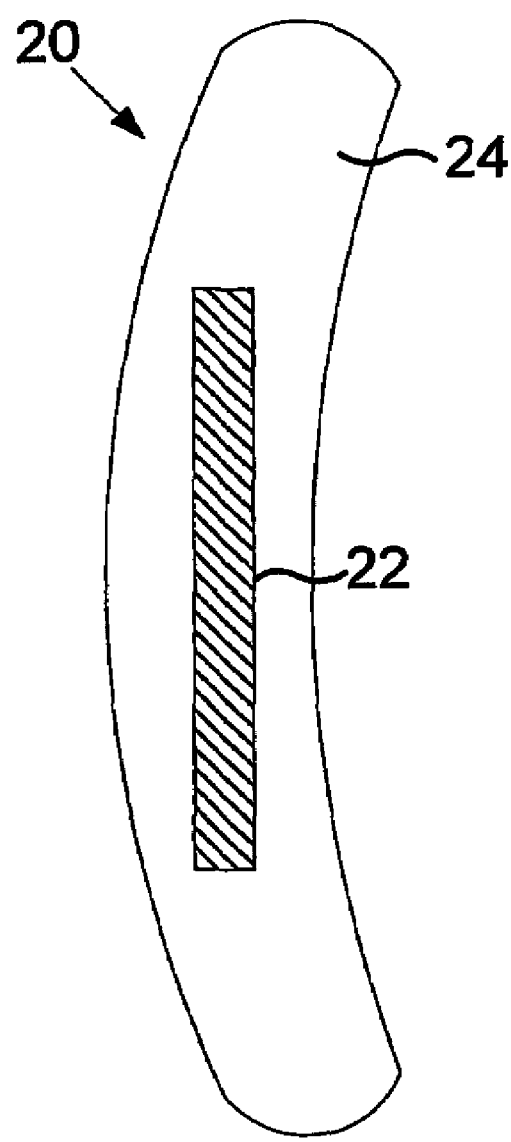
FIG. 2 is a schematic side view of the contact lens of FIG. 1.
Figure 8:
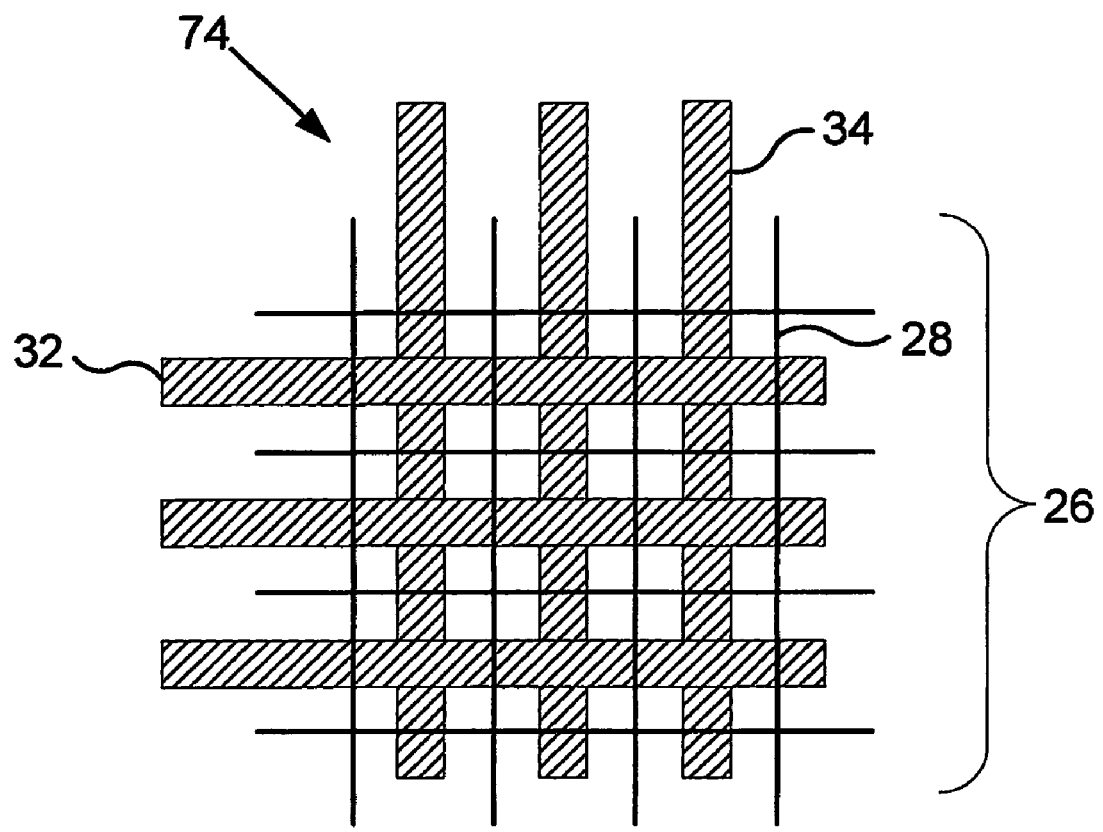
FIG. 8 is a schematic frontal view of an integrated optoelectronic device, showing an electrode structure used in the device, in accordance with an embodiment of the present invention.
Figure 9:
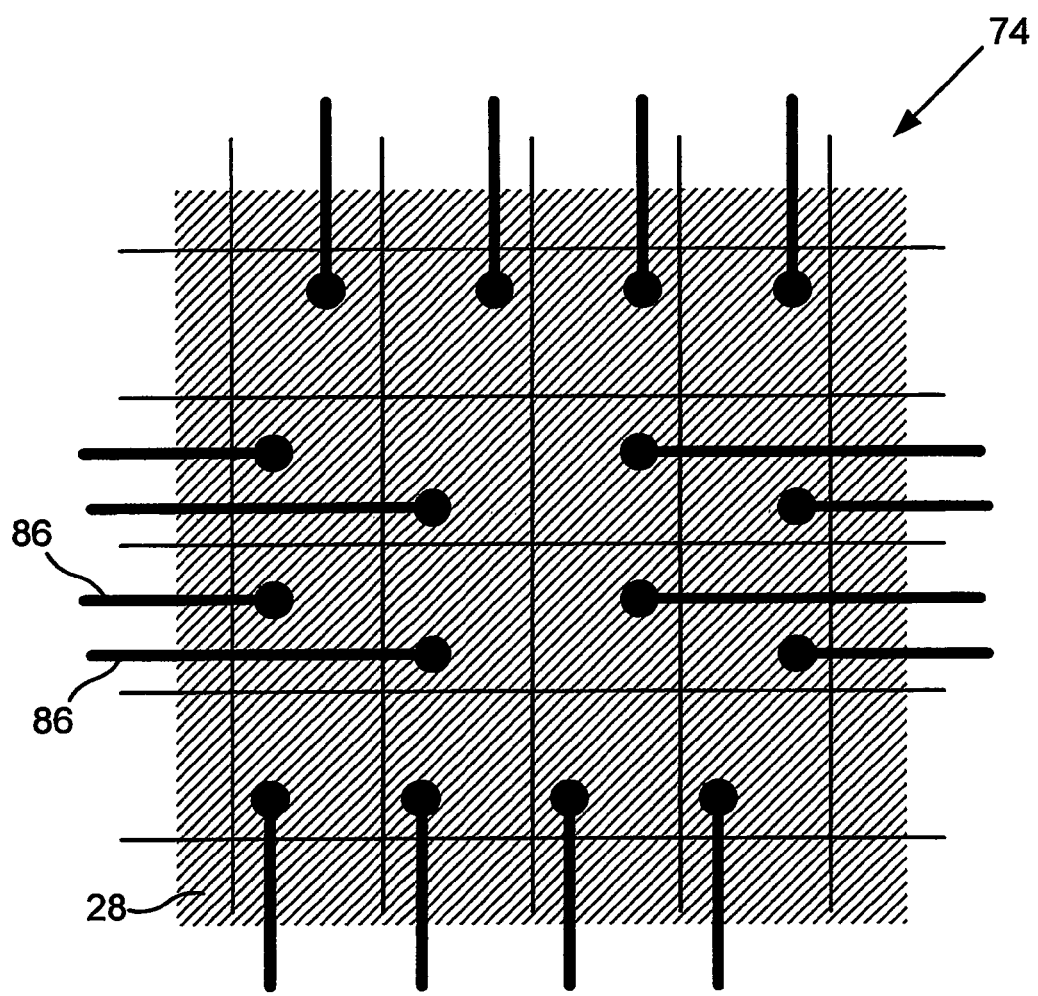
FIG. 9 is a schematic frontal view of an integrated optoelectronic device, showing an electrode structure used in the device, in accordance with an alternative embodiment of the present invention.

Reference is now made to FIGS. 1 and 2, which respectively show frontal and side views of an integrated multifocal lens 20, in accordance with an embodiment of the present invention. Lens 20 comprises an integrated focal modulation device 22, which is encapsulated in a lens body 24 made of a suitable optical material, such as glass or transparent plastic. In other embodiments, device 22 may be attached to the front or rear surface of such a lens body. Device 22 typically comprises a single integrated circuit chip, although multi-chip implementations are also possible, as described further hereinbelow. In this embodiment, lens 20 is made for use as a contact lens, but in alternative embodiments, described hereinbelow, focal control devices like device 22 may be encapsulated in lenses of other types, such as intraocular lenses and spectacle lenses, as shown in FIGS. 8 and 9 below.

Device 22 comprises a spatial light modulator (SLM) 26, which comprises an array of miniature light-modulating elements 28, such as liquid crystal elements. (The individual elements 28 are used to create respective pixels of a light modulation pattern. The physical structures that contain elements 28 within device 22 are referred to as "cells.") Typically, for contact lens applications, SLM 26 comprises an array of about 250×250 pixels, with a pixel pitch of about 20 µm. A controller 30 determines the state of each element 28 by means of suitable control signals conveyed via row control lines 32 and column control lines 34. Controller 30 receives power from one or more photovoltaic cells 36, which are integrated in device 22. In an embodiment described hereinbelow, controller 30 drives elements 28 to rapidly change their indices of refraction, and thus rapidly modulate the focal length of lens 20. Timing signals for this purpose are provided by an oscillator 38, which is likewise integrated in device 22.

Figure 3:
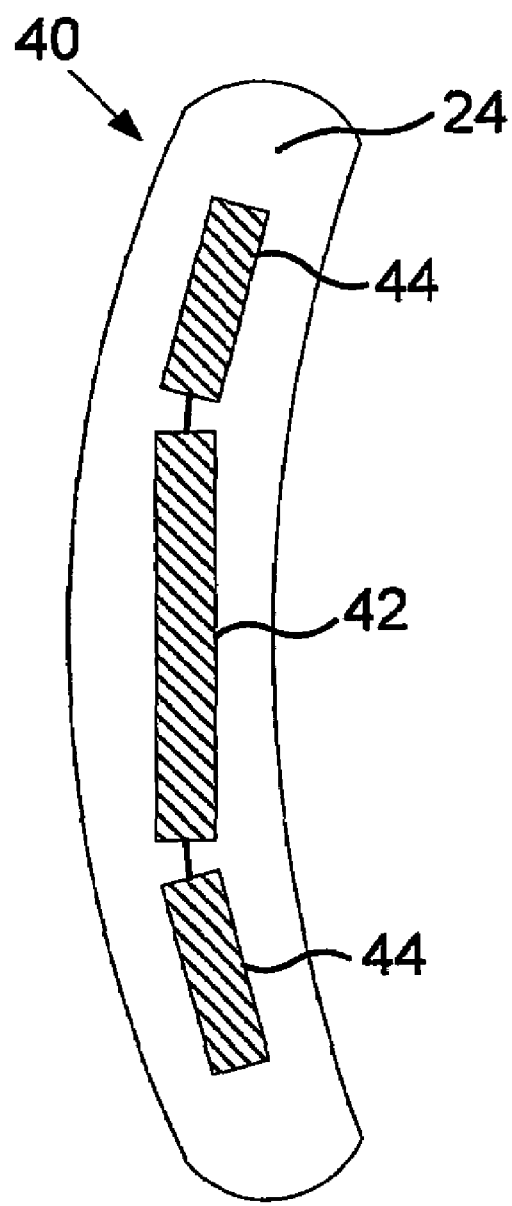
FIG. 3 is a schematic side view of a multifocal contact lens, in accordance with another embodiment of the present invention.

FIG. 3 is a schematic side view of a multifocal lens 40 in accordance with an alternative embodiment of the present invention. This embodiment is similar to that of FIGS. 1 and 2, except that two or more separate components are used in implementing the integrated focal control device. For example, a spatial light modulator (like SLM 26) may be fabricated as a central component 42, which is connected by suitable conductors to one or more peripheral components 44, which contain the power and control electronics. In this embodiment, the central component 42 and peripheral components 44 may be fabricated separately, using different fabrication technologies, as opposed to the single-chip implementation of FIGS. 1 and 2.

In an embodiment of the present invention, each of light modulating elements 28 has two states, which are arbitrarily referred to as "on" and "off" states. The elements are turned on and off by application of appropriate control signals on lines 32 and 34. Turning an element on causes the element to apply a predetermined phase shift to light passing through the element, relative to light passing through elements that are off. When all of elements 28 are turned off, lens 20 defaults to the inherent focal length of lens body 24. This focal length is typically chosen to give the refractive correction that the user requires for distance vision.

To modify the refractive power of lens 20, selected elements 28 of SLM 26 are turned on. For example, the elements that are turned on may be chosen to form a pattern of concentric rings, as in a Fresnel lens. The spacing of the rings determines the added refractive power induced by the SLM. Typically, the elements to be turned on are selected so that when the SLM is actuated, lens 20 provides the refractive correction that the user requires for near vision. Additionally or alternatively, appropriate elements 28 of SLM 26 may be actuated to correct for middle visual distances. In some embodiments, lens 20 may have three or more different distance settings, rather than only near and far corrections. Further additionally or alternatively, lens body 24 and/or the pixel pattern in which SLM 26 is actuated may be designed to correct for other visual defects, such as astigmatism.

Figure 4:
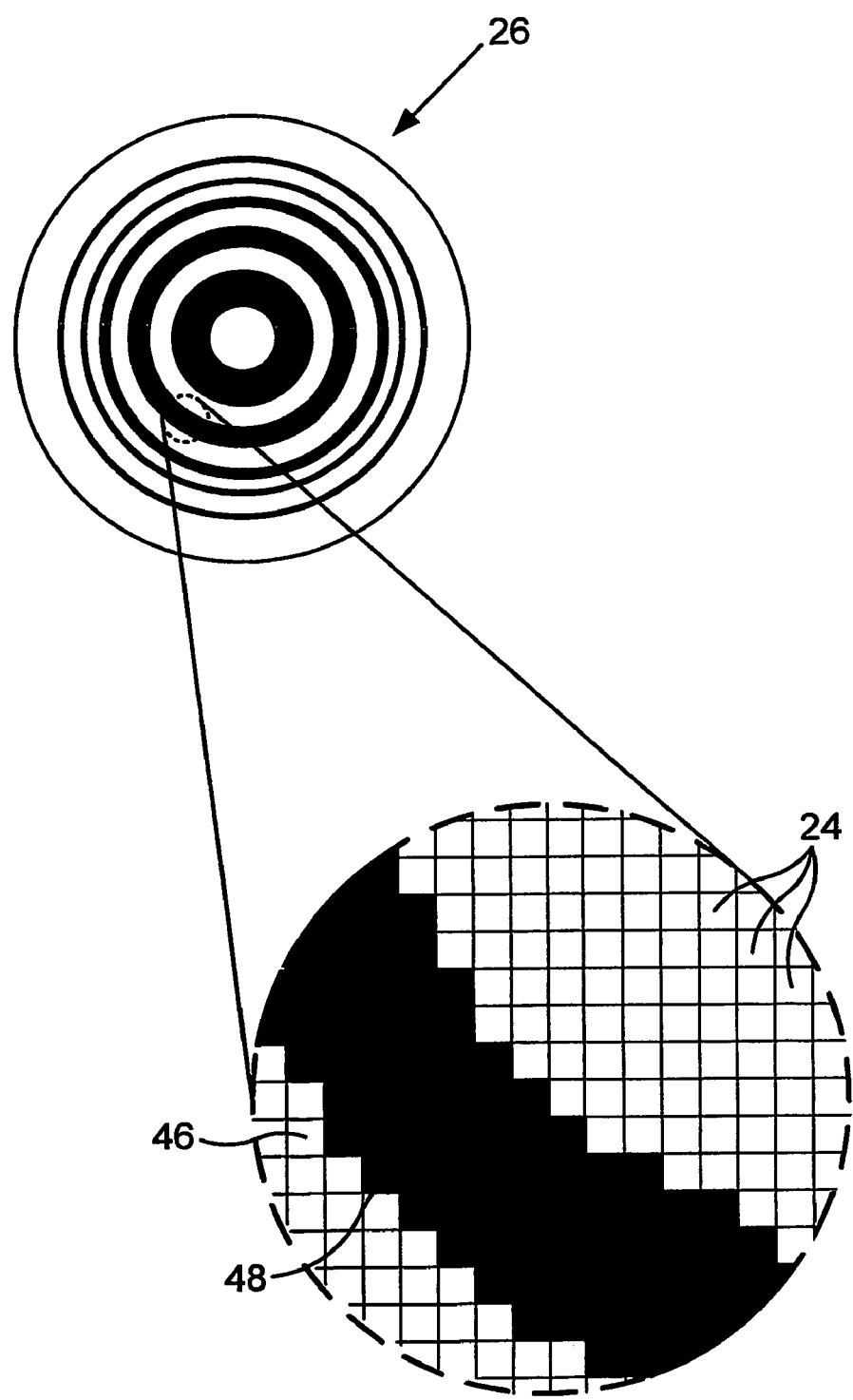
FIG. 4 is a schematic frontal view of a spatial light modulator, showing details of a modulation pattern, in accordance with an embodiment of the present invention.

FIG. 4 is a schematic, frontal view of SLM 26 showing a modulation pattern created by the device, in accordance with an embodiment of the present invention. The pattern comprises concentric clear rings 46 and opaque rings 48, which are created by combining the SLM with a suitable polarizing layer. These rings define a Fresnel zone plate that can be turned on and off to modulate the focal length of lens 20

Although the embodiment described above is based on binary modulation using a linear matrix of elements 28, in other embodiments of the present invention focal modulation device 22 may use other focal modulation schemes. For example, elements 28 may be subject to analog control, so that the phase shift created by each element is continuously variable. In another embodiment, the individual light modulating elements themselves are shaped as rings, typically in a pattern of the sort shown in FIG. 4, so as to function as a Fresnel lens or zone plate. Alternatively, other focal modulation schemes that are known in the art may be applied in lens 20 to create the unique temporal pattern of focal modulation that is described hereinbelow.

Figure 5:
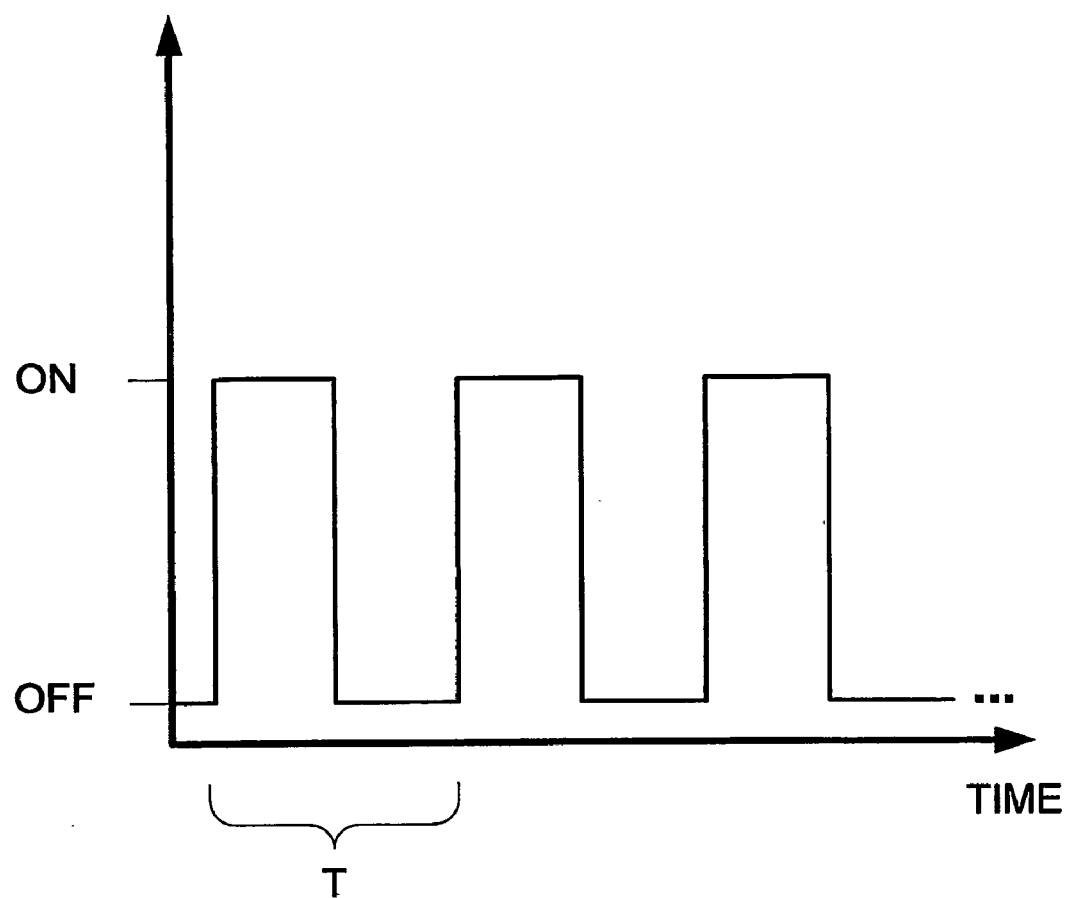
FIG. 5 is a timing diagram that schematically illustrates focal modulation signals applied in a multifocal lens, in accordance with an embodiment of the present invention.

FIG. 5 is a timing diagram that schematically illustrates control signals applied to selected light modulating elements 28, in accordance with an embodiment of the present invention. As noted above, these signals are applied to selected pixels so that in the "on" state, images of near objects are focused on the user's retina, while in the "off" state, images of distant objects are focused. Controller 30 toggles the state of SLM 26 so that lens 20 alternates between near and distant foci with a period T. Although the waveform shown in FIG. 4 has a duty cycle of approximately 50%, higher or lower duty cycles may also be used.

The period T is chosen so that the focal state of device 22 varies faster than the flicker-fusion frequency of the user's eye. The threshold flicker-fusion frequency for most people is about 16 Hz. Thus, the inventors have found, for example, that 12 ms<T<30 ms gives good results. Under these conditions, the near and distant images are focused onto the user's retina in alternation, in such a way that the user is not aware that the images are alternating. The user's brain sorts out the near and distant images so that the user perceives a focused image of the object on which his or her attention is focused. The information and energy carried by the defocused image -may also contribute to the recognition process in the brain. The inventors have determined in experiments on human subjects that the subjects tend to perceive both near and distant objects more clearly when the focused images are projected on the retina in alternation, as opposed to when the focused images of the near and distant objects are superimposed on the retina simultaneously. It appears that subliminal visual perception mechanisms operate more effectively when stimulated by the alternating images.

Controller 30 implements the temporal modulation scheme represented by FIG. 4 autonomously, with no requirement for control or power to be supplied from a source outside lens 20. The power required for the modulation is supplied by photovoltaic cells 36 by conversion of ambient light, while the modulation clock is provided by oscillator 38. Thus, lens 20 is entirely self-contained and may be worn and used like a conventional contact lens. Note that in the absence of sufficient ambient light to power controller 30, lens 20 simply defaults to the distant vision refraction of lens body 24.

As noted above, the focal modulation scheme exemplified by FIG. 5 may be implemented using lens 20 with embedded device 22, or using any of the variations on device 22 that were described earlier. Similarly, this scheme may be carried out using a suitable intraocular lens or spectacle lenses, as described below, or by a suitable focal modulation device alone, without an additional lens. Furthermore, the inventive principles of multifocal vision enhancement by rapid switching of focal depth are not limited to the sorts of optoelectronic focal modulation devices described herein. Rather, these principles may also be implemented using optical assemblies of other sorts that permit focal-depth switching, including other types of spatial light modulators, optomechanical devices, and electro-optical and acousto-optical systems. All such alternative implementations are considered to be within the scope of the present invention.

Figure 6:
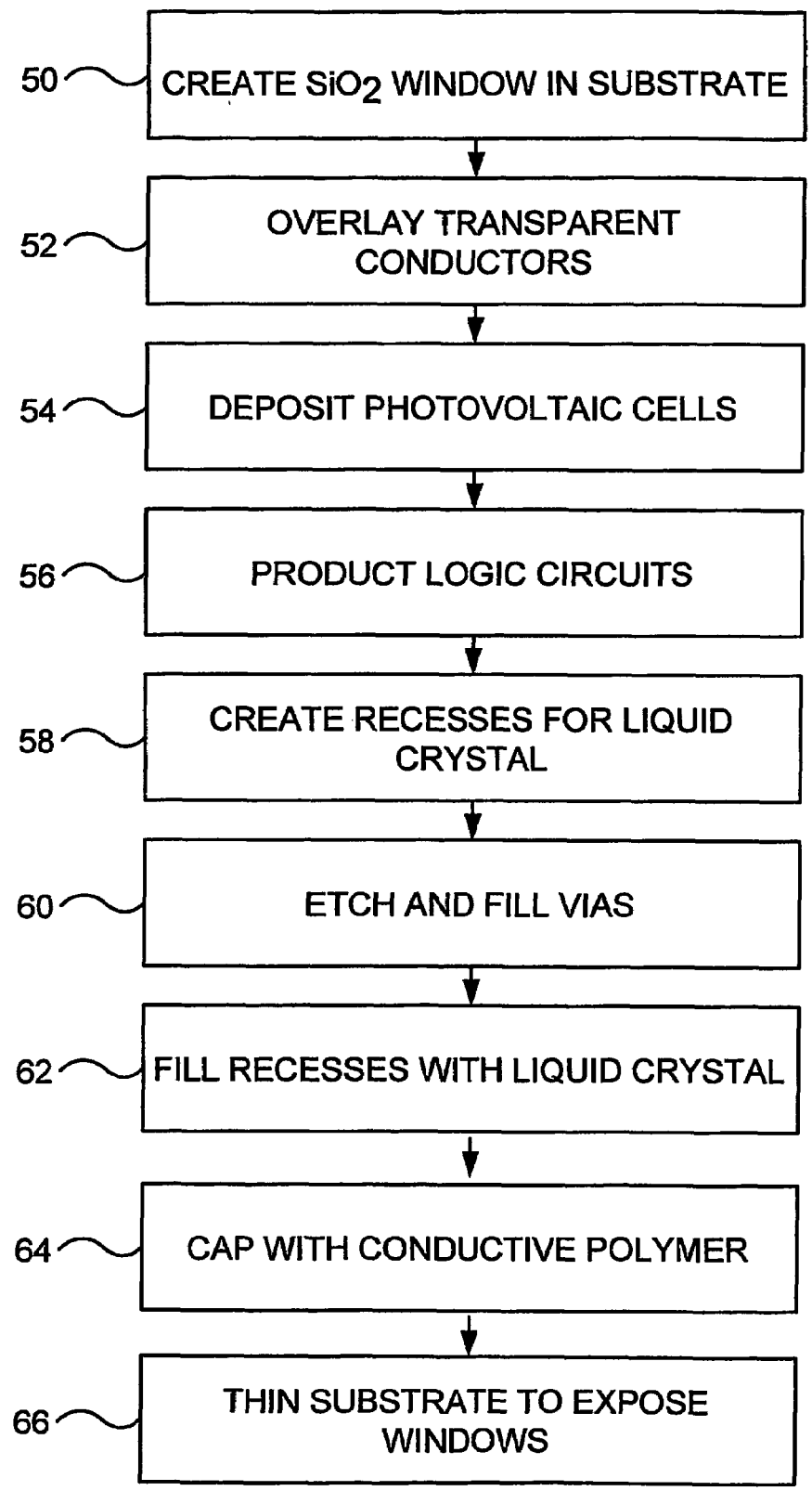
FIG. 6 is a flow chart that schematically illustrates a method for fabricating an integrated optoelectronic device, in accordance with an embodiment of the present invention.
Figure 7:
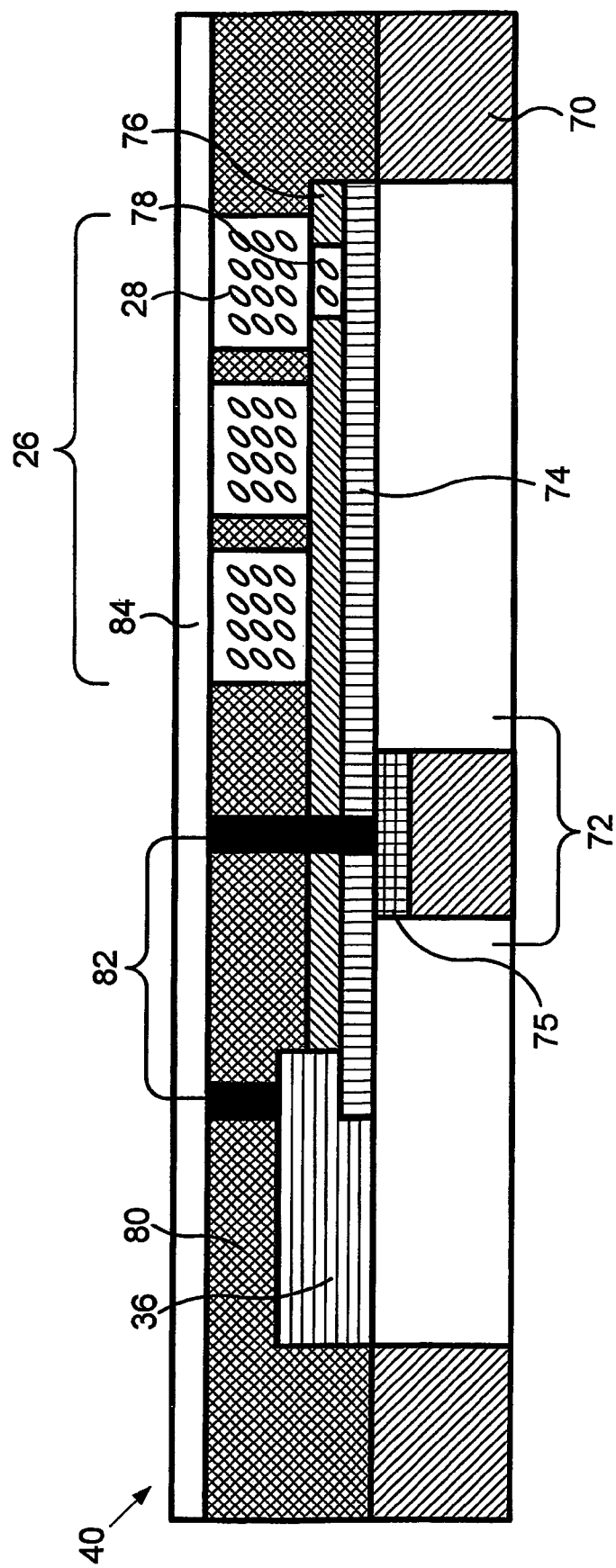
FIG. 7 is a schematic, sectional illustration of an integrated optoelectronic device, in accordance with an embodiment of the present invention.

FIG. 6 is a flow chart that schematically illustrates a method for fabrication of focal control device 22, in accordance with an embodiment of the present invention. According to this method, device 22 is fabricated on a silicon substrate, using processes known in the art, such as CMOS fabrication processes. Additional novel processing steps are added, as described hereinbelow, in order to create SLM 26 on the silicon chip. Although for convenience and simplicity of description, the steps in the method of FIG. 5 are shown in a certain order, the ordering of some of the steps may be changed while still achieving the same final result, i.e., a single-chip device operating on the principles described above. Such alternative orderings will be apparent to those skilled in the art and are considered to be within the scope of the present invention. The final result of the process is shown in FIG. 7.

To perform the functions described hereinabove, device 22 should be transparent, at least in the area of SLM 26. Thus, the first step in fabricating the device is to create one or more transparent windows in the substrate at the location to be occupied by the SLM, at a window formation step 50. Typically, such windows are created by etching a recess in the silicon substrate and then depositing $SiO_2$ in the recess, using suitable methods known in the art. A similar window or windows may be created at the locations of photocells 36.

Conductors are then deposited over the surface of the $SiO_2$ (and typically over neighboring areas of the substrate, as well) to serve as electrodes for light modulating elements 28, at an electrode deposition step 52. Suitable transparent conductive materials for this purpose are known in the art, for example ITO (indium tin oxide). The conductors are typically located so as to form lines 32 and 34 that contact light-modulating elements 28, as shown below in FIG. 8. The conductors may be arranged in multiple layers, with one or more insulating layers intervening, so as to permit the lines to overlap. Other conductors are arranged to connect photovoltaic cells 36 to controller 30 and oscillator 38. The photovoltaic cells, typically in the form of a polycrystalline silicon layer, are then formed over the substrate (or over the $SiO_2$ windows) at the appropriate locations, at a photovoltaic cell deposition step 54. The logic circuits in device 22, such as controller 30 and oscillator 38, are also formed on the substrate, using a CMOS process, for example, at a logic fabrication step 56.

Next the array of liquid crystal elements 28 is formed on the substrate. For this purpose, a matrix of recesses, or cells, is produced for receiving the liquid crystal material, at a recess formation step 58. Typically, the matrix comprises a layer of transparent polymer, 10-20 μm thick. Alternatively, other materials may be used to create the recesses. The recesses in the polymer layer may be created by screen printing, or by any other suitable process known in the art. Each recess has openings in its bottom for contacting the row and column conductors below it. Optionally, a transparent insulating layer, such as $SiO_2$, may be deposited over the conductors before screen printing of the layer with recesses over the insulating layer. In this case, the insulating layer will have the openings necessary to provide electrical contact between each of the recesses and the conductors below it.

The layer of polymer that is used to create the matrix of recesses for the liquid crystal material also overlies other regions of the chip, such as those containing the photovoltaic cells and logic circuits. Therefore, vias are printed or etched through the polymer layer, and possibly through layers beneath it, as well, in order to make contact with appropriate locations on the photovoltaic cells and circuits, at a via creation step 60. The vias are then filled with metal so as to provide electrical contact with these locations. The vias may be used to connect the photovoltaic cells and circuits to a ground plane that is formed over the polymer layer, as described below.

The recesses in the polymer layer are filled with liquid crystal material, at a filling step 62. The upper surface of device 22 is then covered with a layer of conductive polymer, at a capping step 64. The polymer serves to seal the liquid crystal material inside the recesses, as well as to provide a common ground contact for all the liquid crystal cells. Methods for creating this polymer layer are described further hereinbelow.

After completing the above steps, the silicon substrate is thinned, at a thinning step 66. The thinning step may be carried out using any suitable method known in the art, such as etching or grinding. The substrate is thinned sufficiently so that the windows created at step 50 are exposed on the lower side of the chip. As a result, device 22 is transparent, as desired, in the area of SLM 26. The device is also very thin, typically no more than a few tens of microns thick, so that it can easily be integrated inside contact lenses and intraocular lenses.

FIG. 7 is a schematic, sectional illustration of device 22, following completion of the process described above. The drawing is not to scale, as the layer thicknesses have been exaggerated for clarity. A silicon substrate 70 has been thinned to expose $SiO_2$ windows 72, as noted above. The windows are overlaid by photovoltaic cell 36 and transparent conductors 74. A logic circuit 75 may be formed on substrate 70 either above conductors 74 or below the conductors, as shown in this figure. An insulating layer 76 is formed over conductors 74, with openings 78 at suitable locations to provide electrical contact between conductors 74 and liquid crystal material that is used in light-modulating elements 28. These elements are contained in recesses in a thick layer 80 of polymer. Vias 82 through layer 80 (and possibly through underlying layers, as well) contact circuit 75 and photovoltaic cell 36. A conductive polymer 84 seals and provides a common ground contact to elements 28, as well as contacting vias 82.

FIG. 8 is a schematic frontal view of conductors 74, which are arranged to form row control lines 32 and column control lines 34, in accordance with an embodiment of the present invention. In this embodiment, the conductors are laid out in two layers, rather than just a single layer as shown in FIG. 7. Each conductor is arranged to contact each of elements 28 in its respective row or column. Thus, any given element may be actuated by applying the appropriate voltage to its row and column conductors simultaneously. A transistor or other switching device (not shown) may be added to each cell in order to extend the length of time during which the elements may be switched on during each cycle.

FIG. 9 is a schematic frontal view of conductors 74, in accordance with an alternative embodiment of the present invention. In this example, each individual element 28 is actuated by its own, individual electrode 86. This arrangement alleviates the need for a transistor or other switch in each cell, but practically tends to limit the number of elements in the SLM. Typically, in this configuration, SLM 26 may comprise about 100×100 pixels with a pitch of 30-50 μm.

The conductor layouts of FIGS. 8 and 9 are shown here by way of example, and other methods may alternatively be used for connecting controller 30 to elements 28. For example, narrow, non-transparent conductors may run along the edges of elements 28. Other conductor and electrode arrangements will be apparent to those skilled in the art.

Returning now to step 64 (FIG. 6), polymer 84 may be formed over the liquid crystal cells by various methods, such as polymerization of a monomer or coating with a polymer solution. According to the first approach, a suitable, reactive monomer mixture is spread over the upper surface of device 22, and is then polymerized to form a perfect, flat polymeric layer. Various initiators may be used to induce polymerization. For example, the monomer mixture may comprise a combination of monomers, oligomers and photoinitiators, which undergo polymerization when exposed to ultraviolet (UV) light. Alternatively, thermal initiators may be included in the monomer mixture, whereupon polymerization is initiated by applying heat to the surface of the film. The polymeric film that is formed may be fully transparent, or it may have a colorant to favor one wavelength range or another. The various features and characteristics outlined above may be achieved using commercially-available film forming compositions, such as UV coatings used in graphic inks, or UV-activated sealants and adhesives.

Alternatively, other materials, not limited to organic polymers or to UV-sensitive materials, may be used. For example, polymer 84 may be formed by coating the substrate with a polymer such as sodium alginate, followed by interaction with a solution of calciun ions. Further alternatively, polymer 84 may comprise a glass layer formed by polymerization using a sol-gel method.

In another embodiment, at step 64, the appropriate areas on the surface of device 22 are coated with a solution containing appropriate polymers in a solvent, such as water. Upon evaporation of the solvent, a polymeric film is left on the surface. In this case, the polymer may be patterned by direct printing. In the monomer-based approach, on the other hand, the polymer film may be patterned by UV illumination through a suitable mask.

Polymer 84 may be made conductive by mixing conductive materials, such as nano-particles of silver, into the monomer or polymer mixture. Typically, layer 80 is constructed using non-conductive polymers, whereas polymer 84 is made to have conductive characteristics so as to serve as the ground electrode. Alternatively, the common ground electrode may be created by forming a layer of electrolytic liquid, such as an aqueous solution or an organic solution containing ammonium derivatives, on top of the liquid crystal material. This conductive layer is then covered with a polymeric film.

Further alternatively, when the conductive polymer is designed to be created on top of a first non-conductive layer, an external conductive layer may be formed over the polymer. For example, the polymer surface may be coated with ITO, using methods known in the art. Alternatively, the polymer surface may be coated with a solution of conductive polymer followed by evaporation to form a conductive polymer layer. Further alternatively, a monomer may be deposited on the surface and then polymerized in situ to form a conductive polymer.

The principles of device design and fabrication described above may be applied not only in producing integrated liquid crystal SLM devices, but also in other types of devices and production processes. For example, the methods described above may also be adapted for use in creating integrated liquid crystal displays. In other embodiments of the present invention, polymer films may be applied as protective and conductive surface layers on other sorts of chips. For instance, the methods described above may be used, mutatis mutandis, to create and seal recesses containing non-solid materials, such as fluids and gels of other types, on integrated circuit substrates. Conductors on the substrate may be used to convey electrical signals to or receive electrical signals from the material in the recesses.

Figure 10:
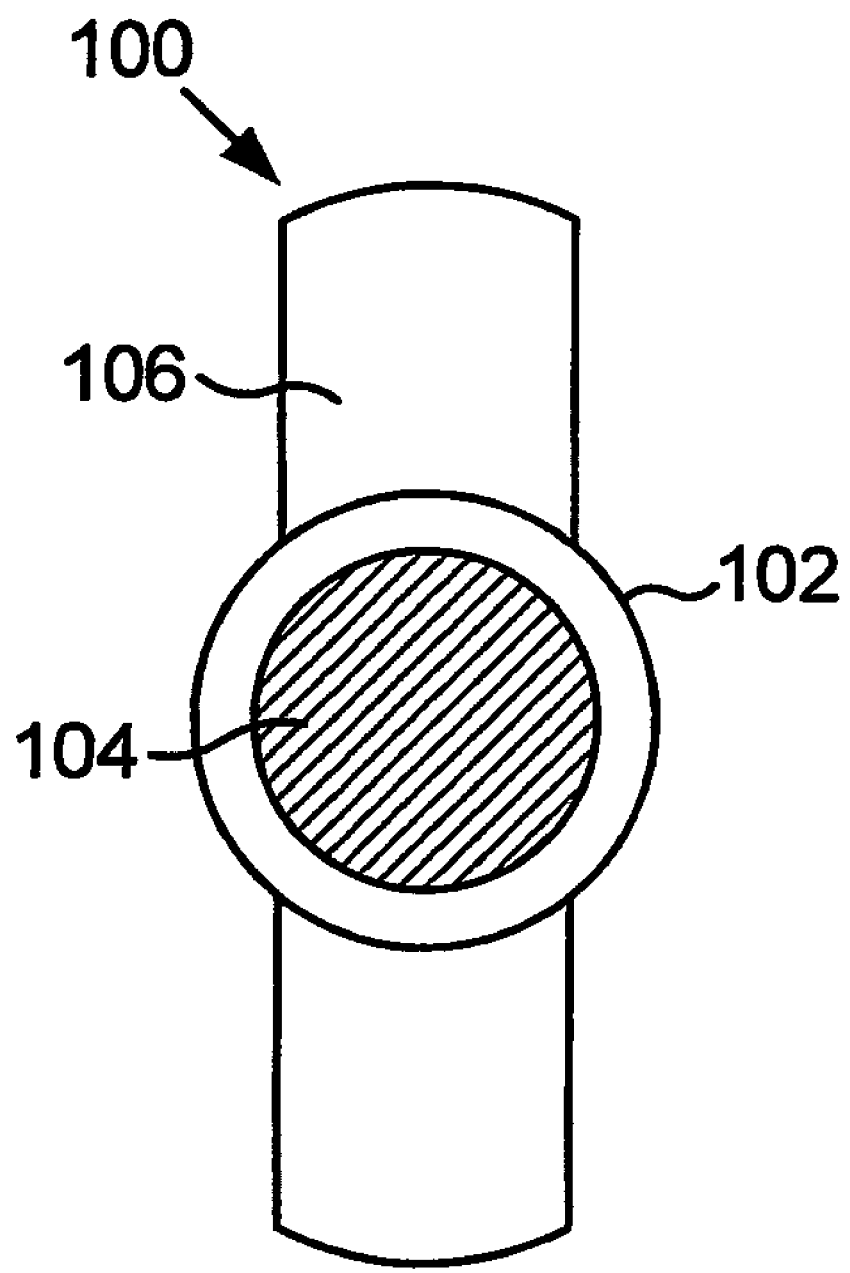
FIG. 10 is a schematic frontal view of a multifocal intraocular lens, in accordance with an embodiment of the present invention.
Figure 11:
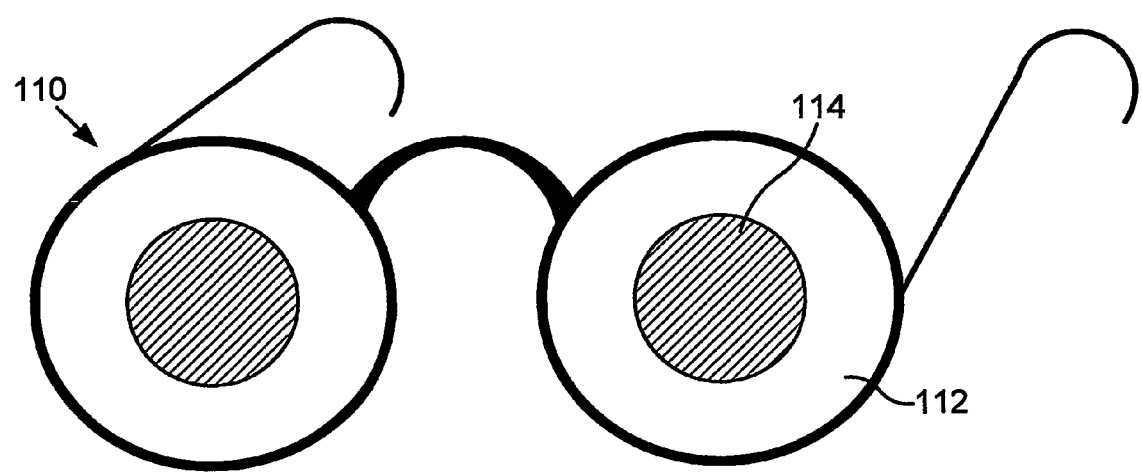
FIG. 11 is a schematic frontal view of multifocal spectacles, in accordance with an embodiment of the present invention.

Reference is now made to FIGS. 10 and 11, which illustrate alternative embodiments of the present invention. In FIG. 10, an intraocular lens 100 comprises a focal modulation device 104 encapsulated in a lens body 102. Anchors 106 are provided for anchoring lens 100 in the appropriate location in the patient's eye. Device 104 is constructed and operates on principles similar to device 22, as described above.

In FIG. 11, focal modulation devices 114 are encapsulated in lenses 112 of spectacles 110. Devices 114 are also constructed and operate on principles similar to device 22, although in the present embodiment, some of the size and power constraints of the preceding embodiments may be relaxed. For example, spectacles 110 may comprise a power source and/or control electronics that are external to lenses 112. It is also possible to mount devices 114 on the front or rear surfaces of lenses 112, or even to use device 114 to correct the user's refraction independently (by rapid switching of focal length), without reliance on a separate glass or plastic lens.

Other applications of the methods for device fabrication and methods for vision correction described above will be apparent to those skilled in the art and are considered to be within the scope of the present invention. For example, although the embodiments described above are based on automatic, rapid switching between different focal lengths, certain principles of the present invention may also be applied in the design and fabrication of variable-focus devices, which switch between two or more different focal lengths in response to external control signals.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Apparatus for enhancing vision of a user having an eye that includes a retina, the apparatus comprising:
    a focal modulation device, which is adapted to focus light from objects in a field of view of the user onto the retina while alternating between at least first and second focal states that are characterized by different, respective first and second focal depths, at a rate in excess of a flicker-fusion frequency of the user.

2. The apparatus according to claim 1, wherein in the first focal state, the focal modulation device is operative to focus the light from distant objects onto the retina, and in the second focal state, the focal modulation device is operative to focus the light from near objects onto the retina.

3. The apparatus according to claim 1, and comprising a lens body, comprising a transparent optical material having a predetermined refractive power, wherein the focal modulation device is adapted to modulate the refractive power of the lens body.

4. The apparatus according to claim 3, wherein the focal modulation device is encapsulated in the lens body.

5. The apparatus according to claim 4, wherein the lens body is adapted to serve as a contact lens on a surface of the eye.

6. The apparatus according to claim 4, wherein the lens body is adapted to be implanted as an intraocular lens within the eye.

7. The apparatus according to claim 3, wherein the lens body is adapted to serve as a spectacle lens.

8. The apparatus according to claim 1, wherein the focal modulation device comprises:
    a spatial light modulator (SLM), which is adapted to focus the light; and
    a control circuit, which is coupled to actuate the SLM so as to alternate between the first and second focal states.

9. The apparatus according to claim 1, wherein the focal modulation device is adapted to alternate between the first and second focal states and a third focal state, which is characterized by a third focal depth, intermediate the first and second focal depths.

10. The apparatus according to claim 1, wherein the focal modulation device is adapted to alternate between the at least first and second focal states with a period of alternation between 12 ms and 20 ms.

11. A method for enhancing vision of a user having an eye that includes a retina, the method comprising focusing light from objects in a field of view of the user onto the retina in alternation between at least first and second focal states that are characterized by different, respective first and second focal depths, at a rate of alternation tat is in excess of a flicker-fusion frequency of the user.

12. The method according to claim 11, wherein focusing the light comprises, in the first focal state, focusing the light from distant objects onto the retina, and in the second focal state, focusing the light from near objects onto the retina.

13. The method according to claim 11, wherein focusing the light comprises placing a lens having a predetermined refractive power between the eye and the field of view, and modulating the refractive power of the lens at the rate of alternation.

14. The method according to claim 13, wherein the lens comprises a lens body, and wherein modulating the refractive power comprises applying electrical signals to an optoelectronic focal modulation device that is encapsulated in the lens body.

15. The method according to claim 14, wherein placing the lens comprises placing the lens body so as to contact a surface of the eye.

16. The method according to claim 14, wherein placing the lens comprises implanting the lens body within the eye.

17. The method according to claim 14, wherein modulating the refractive power comprises generating the electrical signal at the rate of alternation independently of any signal generated externally to the lens.

18. The method according to claim 11, wherein focusing the light comprises mounting a focal modulation device on a spectacle frame, which is worn by the user, and switching the focal modulation device between the first and second focal states.

19. The method according to claim 11, wherein focusing the light comprises placing a spatial light modulator (SLM) between the eye and the field of view, and actuating the SLM so as to alternate between the first and second focal states.

20. The method according to claim 11, wherein focusing the light comprises alternating between the first and second focal states and a third focal state, which is characterized by a third focal depth, intermediate the first and second focal depths.

21. The method according to claim 11, wherein focusing the light comprises alternating between the at least first and second focal states with a period of alternation between 12 ms and 30 ms.

* * * * *